(12) United States Patent
Jacka et al.

(10) Patent No.: US 7,193,222 B2
(45) Date of Patent: Mar. 20, 2007

(54) SECONDARY ELECTRON DETECTOR, ESPECIALLY IN A SCANNING ELECTRON MICROSCOPE

(75) Inventors: Marcus Jacka, York (GB); Martin Zadrazil, Brno (CZ); Filip Lopour, Brno (CZ)

(73) Assignee: Tescan s.r.o., Brno (CZ)

( * ) Notice: Subject to any disclaimer, the term of this patent is extended or adjusted under 35 U.S.C. 154(b) by 64 days.

(21) Appl. No.: 10/518,660

(22) PCT Filed: Jun. 13, 2003

(86) PCT No.: PCT/CZ03/00033

§ 371 (c)(1),
(2), (4) Date: Dec. 17, 2004

(87) PCT Pub. No.: WO2004/059691

PCT Pub. Date: Jul. 15, 2004

(65) Prior Publication Data

US 2005/0230620 A1    Oct. 20, 2005

(30) Foreign Application Priority Data

Jun. 17, 2002 (CZ) .......................... PV 2002-2105

(51) Int. Cl.
*G01N 23/00* (2006.01)
(52) U.S. Cl. ...................... 250/397; 250/310
(58) Field of Classification Search ................ 250/397
See application file for complete search history.

(56) References Cited

U.S. PATENT DOCUMENTS 4,011,450 A * 3/1977 Tagawa et al. ............. 250/310

(Continued)

FOREIGN PATENT DOCUMENTS

| EP | 1179833 | 2/2002 |
|---|---|---|
| GB | 2367686 | 10/2002 |
| WO | WO 98/22971 | 5/1998 |

OTHER PUBLICATIONS

Witold Slowko, *Secondary electron detector with a micro-porous plate for environment SEM*, XP-002268265, Vacuum, Aug. 16, 2001, 2001 Elsevier Science Ltd., Vacuum 63 (2001) 457-461.

(Continued)

*Primary Examiner*—David A. Vanore
(74) *Attorney, Agent, or Firm*—Wood, Herron & Evans, L.L.P.

(57) ABSTRACT

The present invention deals with a secondary electron detector (1), especially in a scanning electron microscope. The subject matter of the invention provides a secondary electrons detector (1) constituted by a sensor (2) located in a detector chamber (3), to which a vacuum air pump (10) is connected to produce vacuum inside the detector chamber (3), the detector chamber (3) being in its wall near to the active surface of the sensor (2) enclosed with a diaphragm featuring high resistance to the transmission of gas and low resistance to the transmission of the electrons. The electrically conductive grid (11) is produced either in the form of a copper screen or as a kapton membrane (12) with orifices (13) and it is equipped on both sides with conductive coating (14, 15). Outside the detector chamber (3), the electrically conductive grid (11) is covered with an input screen (18), which is usually of hemispherical shape and is connected to the low voltage source (19) of 80 to 150 V.

13 Claims, 4 Drawing Sheets

U.S. PATENT DOCUMENTS

| | | | | |
|---|---|---|---|---|
| 4,677,296 A | * | 6/1987 | Lischke et al. | 250/310 |
| 4,785,182 A | | 11/1988 | Mancuso et al. | 250/310 |
| 4,880,976 A | | 11/1989 | Mancuso et al. | 250/310 |
| 5,408,098 A | * | 4/1995 | Wells | 250/310 |
| 6,255,708 B1 | * | 7/2001 | Sudharsanan et al. | 257/428 |
| 6,781,124 B2 | * | 8/2004 | Hayn | 250/310 |
| 6,888,140 B2 | * | 5/2005 | Hayn | 250/311 |
| 6,943,352 B2 | * | 9/2005 | Hayn | 250/310 |
| 7,060,978 B2 | * | 6/2006 | Drexel et al. | 250/310 |

OTHER PUBLICATIONS

European Patent Office, International Search Report for Corresponding PCT Application No. PCT/CZ 03/00033 mailed on Feb. 13, 2004 (3 pages).

* cited by examiner

SECONDARY ELECTRON DETECTOR, ESPECIALLY IN A SCANNING ELECTRON MICROSCOPE

FIELD OF THE INVENTION

The invention relates to a secondary electron detector, especially in a scanning electron microscope.

BACKGROUND OF THE INVENTION

To create an image of a specimen by means of a scanning electron microscopy, a sample is scanned by an electron beam. Secondary electrons that are emitted from the sample by the striking electron beam are detected and by this signal a synchronously scanned electron beam in a monitor is modulated. The scanning usually takes place within a vacuum, especially to enable the action of both the electron gun and the electron detector.

The handling of a specimen within a vacuum presents a lot of problems. The biological specimens not survive within a vacuum, wet specimens evaporate before an exact image can be produced. An observation of specimens from which different gaseous substances may leak within a vacuum of the microscope should be carefully considered in advance. Nonconductive samples within a vacuum accumulate static charges on their surface, making thus precision microscopy practically impossible. This problem would be solved by coating such specimens, which, in some specimens such as semiconductors, may entail their destruction and thus it is practically impossible to carry out their nondestructive analysis.

A series of experiments has been carried out to observe specimens in which the vacuum of the microscope specimen chamber was separated from the source of the electron beam to enable the observation of the specimen while maintaining sufficient vacuum in the region of the electron gun. U.S. Pat. Nos. 4,785,182 and 4,880,976 by James F. Mancuso et al. describe a secondary electron detector to be used in gaseous atmosphere. In this case the vacuum of the electron gun and electron microscope column is established to the value common in the electron microscopy. This part of the electron microscope is then separated from the specimen chamber by a pressure reducing diaphragm, which is substantially a lid enclosing this part of the electron microscope. A small orifice is made in the middle of the lid enabling the passage of the electron beam, nevertheless, it establishes considerable resistance to the flow of gas from the specimen chamber to the electron gun. When high-efficiency vacuum pumps are used, the vacuum can be maintained at a value acceptable for the operation of the electron gun and in turn the gas pressure in the specimen chamber can be maintained at the level required by the specimen or sample. Between the sample and the pressure-limiting diaphragm a plate electrode with an orifice in the middle is located to enable the passage of the electron beam, to which electric potential is applied. The secondary electrons emitted from the sample are attracted by the electric field of the electrode and conveyed to the detector.

The evident disadvantage this arrangement suffers is the impossibility of simultaneously optimizing the pressure within the specimen chamber and the pressure in the detector chamber. If, in consideration of the biological samples and their survival within the vacuum, the pressure is maintained at a higher level, the conditions necessary for the operation of the detector are generally insufficient and, vice versa, if the vacuum in the specimen chamber is established to an optimum value for the detector operation, the biological samples do not survive and no non-destructive observation can be performed.

WO 98/22971, applied for by Leo Electron Microscopy Limited, describes another system, in which negative voltage is applied to a sample holder and this voltage repels secondary electrons emitted from the sample by the primary electron beam into a collision zone in a specimen chamber, in which the collisions of the accelerated secondary electrons and gas molecules in the gaseous medium triggers a cascade of collisions and thus generate an amplified signal of secondary electrons, which is detected in the microscope. This signal comprises photons generated by the collisions of the accelerated secondary electrons and the gas molecules in the gaseous medium and it is detected by a photo-multiplier, to which the photons are conveyed via a light guide.

Nevertheless, this system has not solved thoroughly the problem of choking the secondary electrons signal by the back-scattered electrons signal. In addition to it, the photon signal is usually very weak and the quality of the produced image is low.

UK Patent No. 2367686 by Leo Electron Microscopy Limited, describes another system that uses a detector chamber having a different vacuum value than the specimen chamber, both chambers being separated by a thin Al foil that should prevent the gas from the specimen chamber to penetrate to the detector chamber while at the same time enable the electrons to pass through the foil from the specimen chamber to the detector chamber.

The disadvantage of this system is that it does not sufficiently differentiate between secondary electron signal that gives a topographical information and a backscattered electrons signal that gives an information about the material of the specimen. Namely, a backscattered electron easily penetrates the Al foil and causes the emission of the secondary electrons from the surface of the foil that faces the scintillator. These electrons are then attracted by the scintillator and the signal with a topographical information is thus mixed with a signal that bears an information about the material of the specimen. Further mixture of both types of information occur if the backscattered electron impinges, after passing through the Al foil, directly the scintillator. Another disadvantage is that the Al foil is too thin, about 7,5 nm, and is thus vulnerable to a damage in use. Further disadvantage is that the foil is in the specimen chamber environment easily contaminated and considering how thin the foil is, the contamination layer acquires soon a thickness comparable with the thickness of the foil, what results in worse penetrability of low energy secondary electrons without influencing high energy backscattered electrons and thus in a worse efficiency of signal collection.

SUBJECT MATTER OF THE INVENTION

The stated shortcomings of the previous state of the art are noticeably eliminated by a secondary electron detector, especially in a scanning electron microscope, where the subject matter of the invention consists in the fact that the secondary electron detector is constituted by a sensor situated in a detector chamber, to which a vacuum pump is coupled to create a vacuum inside the detector chamber, while the detector chamber is closed in its wall near to an active surface of the sensor by a diaphragm featuring high resistance to a transmission of gas and low resistance to a transmission of the electrons. All its remaining walls separate in a vacuum-tight manner the interior of the detector chamber from an ambient medium.

This diaphragm featuring high resistance to the transmittance of gas and low resistance to the transmittance of the electrons is constituted by an electrically conductive grid to which at least one bias voltage source is connected.

The electrically conductive grid is preferably made of copper or it is constituted by a diaphragm made of perforated electrical insulating material, for example KAPTON®, which is a kind of polyimide, while this diaphragm is fitted with the first conducting coating on the side near to the sensor and with the second conducting coating applied to its reverse side, where the first conducting coating is electrically isolated from the second conducting coating.

The bias voltage source is preferably a source of bias voltage of 50 to 2000 V and even more preferably the source of bias voltage of 250 to 700 V.

In another embodiment of the secondary electron detector, the sensor is constituted by a light guide, with an ionization grid being arranged between its Input and the electrically conductive grid and connected to the ionization voltage source, while the light guide output is led to the photomultiplier input.

The preferred embodiment of the light guide is at its input fitted with a scintillator featuring a conducting coating on the side near to the electrically conductive grid, to which a high voltage source is connected.

In another exemplified embodiment, the sensor is constituted by a PIN diode.

In another exemplified embodiment, the sensor is fitted with a metallic disk to which a high voltage source and a current detector are connected.

In all the above described embodiments, the electrically conductive grid is outside the detector chamber preferably covered with an input screen, preferably of hemispherical shape, connected to a low voltage source of 50 to 500 V or preferably of 80 to 150 V.

BRIEF DESCRIPTION OF THE DRAWINGS

The invention will be described in detail according to the enclosed drawings, where.

DESCRIPTION OF PREFERRED EMBODIMENTS

Figure 1:
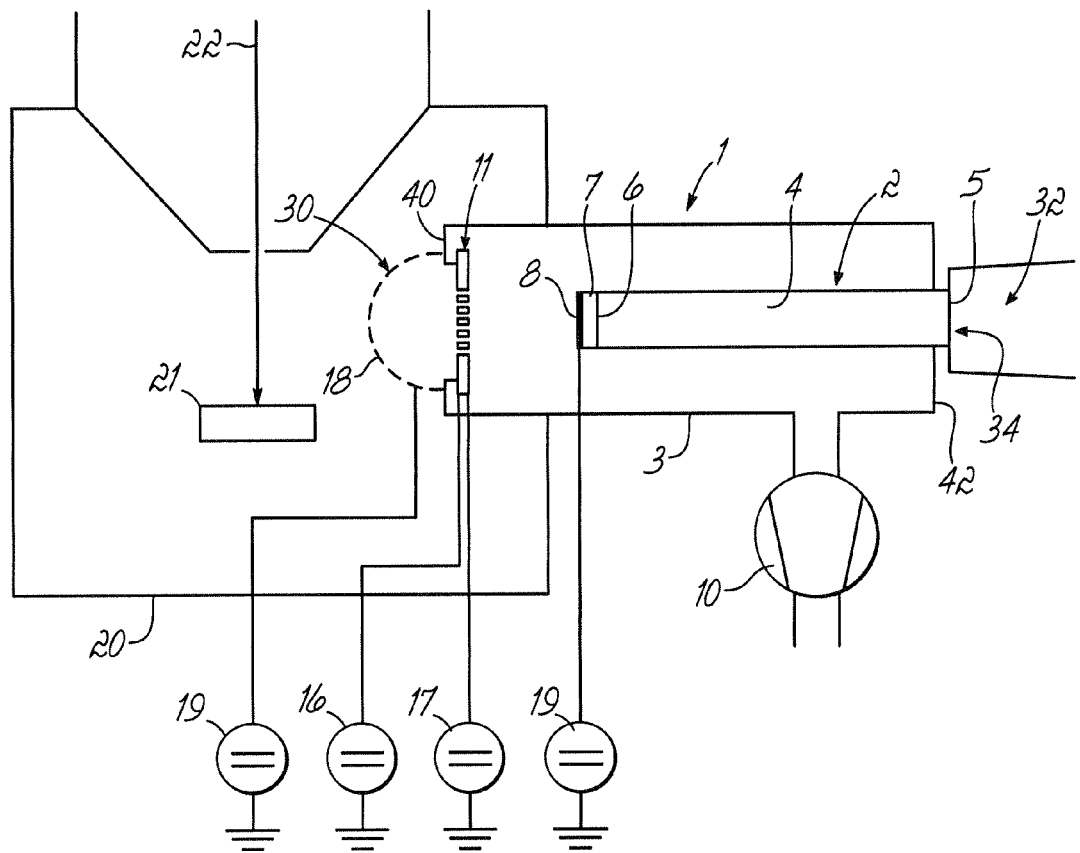
FIG. 1 shows the preferred embodiment of the secondary electron detector fitted with the KAPTON® diaphragm according to the present invention, in the specimen chamber of the electron microscope.
Figure 3:
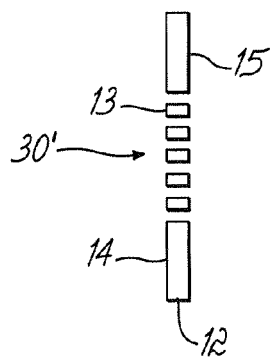
FIG. 3 shows the sectional view of the KAPTON® diaphragm used in the first exemplified embodiment of the detector according to this invention.

FIG. 1 shows the first exemplified embodiment of the secondary electron detector according to the present invention. The secondary electrons detector 1 consists of the sensor 2 located in the chamber 3 of the detector. The sensor 2 consists of the light guide 4 to whose output 5 the photo-multiplier 32 is connected and to whose output 6 the scintillator 7 is connected, whose surface is coated, while to the active surface or coating 8 of the scintillator 7 the high voltage source 9 is connected. To the detector chamber 3 vacuum air pump 10 is connected to create vacuum inside the detector chamber 3. The wall 40 of the detector chamber 3 near to the scintillator 7 is enclosed by an electrically conductive grid 11 constructed from diaphragm 12, in the given embodiment of KAPTON®, with orifices 13 and fitted on both sides with conducting coatings 14 and 15. The configuration of KAPTON® diaphragm 12 is shown in detail in FIG. 3. To both conducting coatings 14, 15 voltage sources 16, 17 are connected. To the first conducting coating 14 near to sensor 2 the source 16 of a voltage of 250 V is connected and to the second conducting coating 15 far from sensor 2 the source 17 of a voltage of 500 V is connected. The electrically conductive grid 11 is covered outside the detector chamber 3 with hemispherical input grid 18, which is connected to source 19 of low voltage of 80 to 150 V. Light guide 4 has its output 5 situated outside the detector chamber 3 and its passage through the wall 42 of the detector chamber 3 is vacuum tight. The detector chamber 3 is located in the specimen chamber 20 of the electron microscope. Front panel 3 of the secondary electrons detector 1 fitted with hemispherical input grid 18 is near to the specimen 21 in the specimen chamber 20.

The secondary electrons detector 1 in the first exemplified embodiment works as follows: The electron beam 22 accelerated in the electron microscope strikes the surface of specimen 21 and the impinging electrons cause the emission of the secondary electrons from the surface of specimen 21, the energy of the emitted secondary electrons being only a few electronvolts, while the back-scattered electrons have the energy of several kiloelectronvolts. The back-scattered electrons are scattered to different directions and only a negligible number of them have the chance of passing through orifices 13 in KAPTON® diaphragm 12, as the electric field of the hemispherical input grid 18, to which a potential of 80 V is applied, has itself a negligible energy by comparison with the energy of the back-scattered electrons. By contrast with this, the secondary electrons, in view of their low proper energy, are strongly attracted by the electric field of the hemispherical grid 18. Due to the gaseous atmosphere in the electron microscope specimen chamber 20 the electrons collide in course of their movement with the gas molecules and thus further secondary electrons are created and thus the effect is multiplied. In the area under the hemispherical input grid 18 an electric field is produced by the 250 V voltage on the first conducting coating 14. This electric field creates electrostatic micro lenses 30 at the holes in the hemispherical input grid 18 and it is transmitted through the holes outside the hemispherical input grid 18. The secondary electrons reaching the surface of the hemispherical input grid 18 thus do not generally impinge on the hemispherical input grid 18, but pass through the holes in the grid to the compartment between the hemispherical input grid 18 and KAPTON® diaphragm 12. They are reattracted in this space by 250 V voltage on the KAPTON® diaphragm 12. Nevertheless, the second conducting coating 15 has a voltage of 500 V and thus in orifices 13 analogous electrostatic lenses are created and the secondary electrons reaching the surface of KAPTON® diaphragm 12 mostly do not strike the first conducting surface 14 but pass through orifices 13 into the detector chamber 3. In this detector chamber 3 they are entrained by the electric field of the coating 8 of the scintillator 7. As it is known in the art, due to the voltage of 10 kV on the coating 8 of the scintillator 7, the secondary electrons pass through the coating 8 and strike the scintillator 7 with an energy of approximately 10 keV. The scintillations produced by the secondary electrons striking scintillator 7 are then transmitted through the light guide 4 to the input 34 of the photomultiplier 32, on whose output a signal appears, whose value is in proportion to the number of secondary electrons emitted from the surface of the specimen 21.

In experiments called out with this arrangement, the KAPTON® diaphragm 12 was used. It was made of a KAPTON® foil 0.125 mm thick plated on both sides with aluminum and subsequently holes were drilled into it of a diameter of 0.15 mm in a square matrix of 10×10 holes with a spacing of 0.5 mm. The pressure in the detector chamber 3 was established by the vacuum air pump 10 to a value of less than 7 Pa. With this arrangement, a satisfactory image was attained even with a primary beam current in the order of tens of pA.

Figure 2:
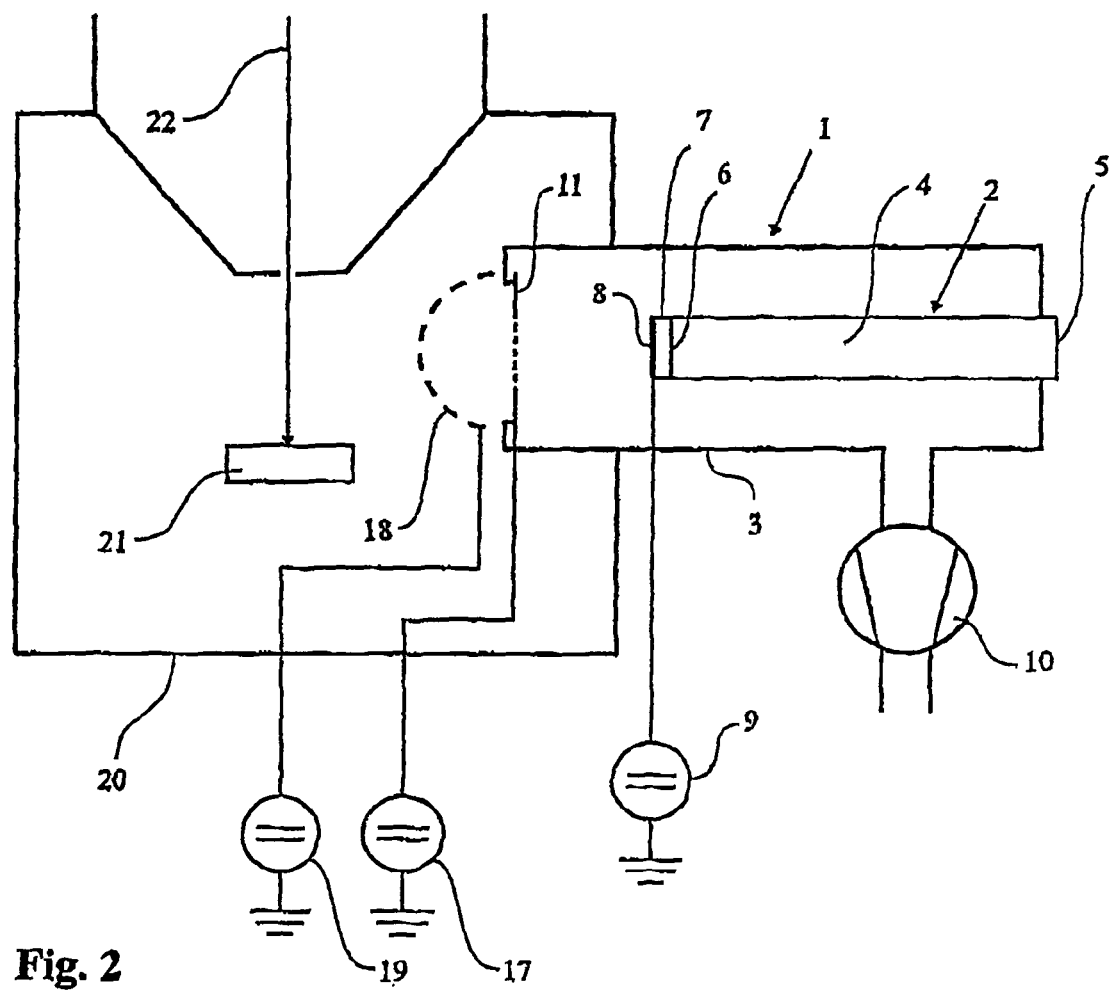
FIG. 2 shows another preferred embodiment of the secondary electron detector with a copper grid, according to the present invention, also in the specimen chamber of the electron microscope.

FIG. 2 shows the second exemplified embodiment of the secondary electron detector according to the present invention. This embodiment differs from the first exemplified embodiment by the fact that a copper grid was used in place of the electrically conductive grid 11. In this embodiment, the system of micro lenses 30 on the electrically conductive grid 11 is omitted that was introduced by the different charges of the two coatings of the KAPTON® diaphragm 12, nevertheless, the electrically conductive grid 11 is located in a strong field of electric voltage of 10 kV on the coating 8 of the scintillator 7 so that a system of micro lenses 30' is also created on the electrically conductive grid 11, which entrains the secondary electrons into the orifices 13 made in the electrically conductive grid 11 and further on to the scintillator 7. In view of the technological difficulties related to the production of the KAPTON® diaphragm 12 with the orifices 13, where the KAPTON® diaphragm 12 must be coated on both sides and the inner walls of the orifices 13 must retain their nonconductive surface, current KAPTON® diaphragms 12 compared to the current copper grids have a much smaller ratio of the area of orifices 13 to the area of the grid material. Thus, due to the current technology of manufacturing the KAPTON® diaphragms 12, the current copper grids achieve a signal by one order higher than the KAPTON® diaphragms 12.

Figure 4:
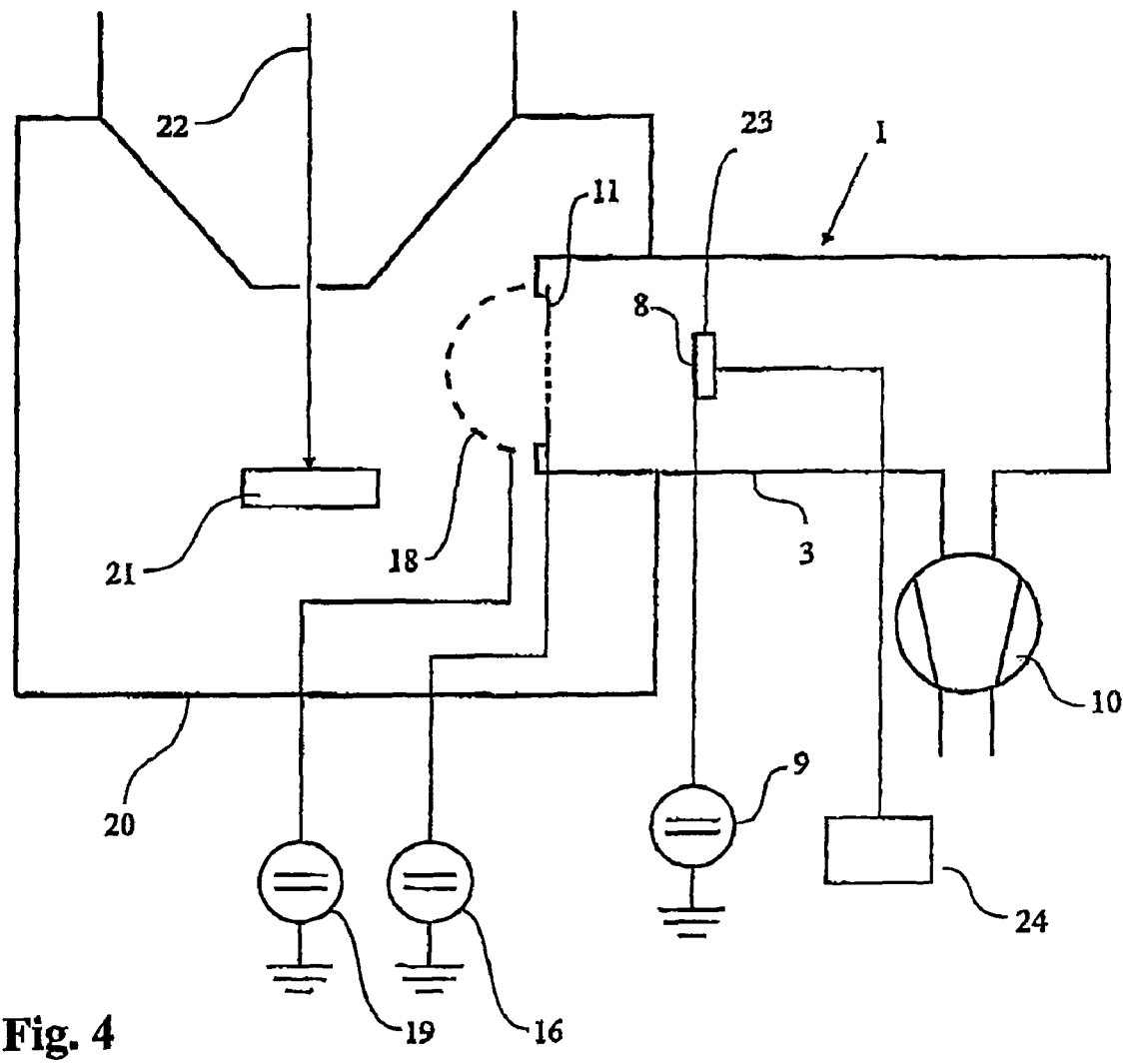
FIG. 4 shows a preferred embodiment of the secondary electron detector with a metallic disk, according to the present invention, also in the specimen chamber of the electron microscope.

FIG. 4 shows another exemplified embodiment of the secondary electron detector 1 according to the present invention. Sensor 2 is fitted with the metallic disk 23 to which the high voltage source 9 and the current detector 24 are connected.

The exemplified embodiment shown in FIG. 4 works as follows: both the secondary electrons, after having passed through conducting grid 11 and being accelerated by the high voltage from the source 9 and the electrons released in the course of ionization of the residual atmosphere inside the detector chamber 3 along the secondary electron path strike, instead of scintillator 7, the metallic disk 23 from where they are conveyed to the current detector 24. The signal detected by the current detector 24 corresponds to the signal of the secondary electrons emitted from the specimen surface.

Figure 5:
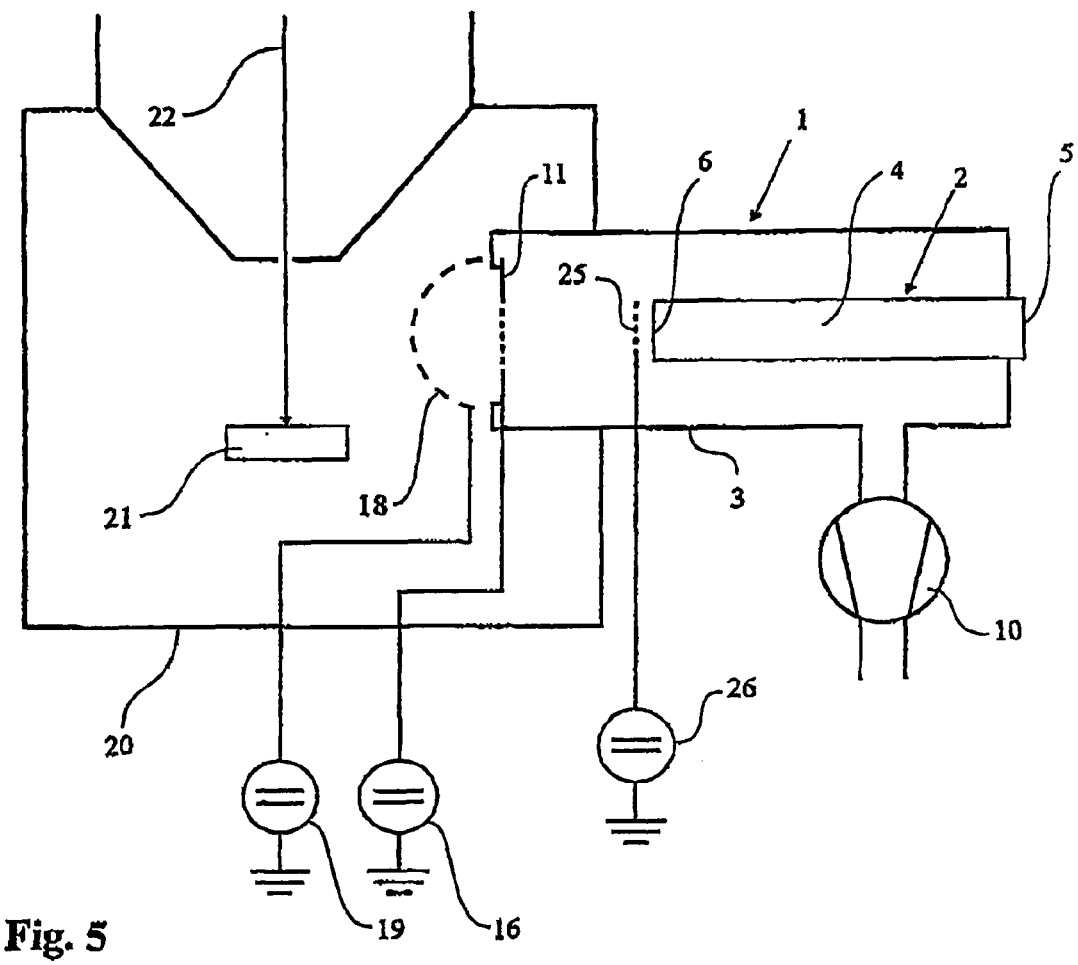
FIG. 5 shows another exemplary embodiment of the detector according to this invention.

FIG. 5 shows the fourth exemplified embodiment of the secondary electron detector 1 according to the present invention. This embodiment differs from the foregoing exemplified embodiments by the fact that the sensor 2 is designed as the light guide 4 between whose input 6 and the diaphragm 11 the ionization grid 25 connected to the ionization voltage source 26 is arranged. In this embodiment, in an analogous way to the foregoing embodiments, the secondary electrons are drawn into the detector chamber 3, where they reach the electric field of the ionization grid 25 by which they are attracted to the ionization grid 25. In this arrangement, the pressure in the detector chamber 3 is usually within the range of 20 to 100 Pa and the electrons are furthermore multiplied along the secondary electrons paths and thus the gas molecules are ionized in the detector chamber 3. In the course of this ionization of the gas molecules, or during their transition to the basic condition, a fluorescence is produced and a light is emitted. A part of the produced light is conveyed via light guide 4 to the photo-multiplier (not shown).

In experiments with the arrangements according to the present invention, a standard copper grid used as a specimen holder in the transmission electron microscopy was applied as electrically conductive grid 11. The active surface of the grid was approx. 2 mm in diameter and it contained approximately 160 orifices of 0.1 mm in diameter. Compared with the KAPTON® diaphragm 12 applied in the preceding embodiment, the area of the orifices was comparable, nevertheless, the orifices were concentrated on a ten times smaller area. A voltage of 400 to 500 V was applied to the grid 11. In this arrangement, a signal approximately ten times stronger was attained than in the case in which the KAPTON® diaphragm 12 was applied and it appears to be the most effective state-of-the-art arrangement, with the added advantage of avoiding the technologically demanding production of the KAPTON® diaphragms 12.

INDUSTRIAL APPLICABILITY OF THE INVENTION

The present invention may be utilized for the production of electron microscopes, especially scanning electron microscopes, in which a higher gas pressure in the microscope specimen chamber is required due to the character of the examined specimen.

The invention claimed is:

1. A secondary electron detector, especially in a scanning electron microscope, comprising:
   a detector chamber adapted to be coupled with a vacuum pump to produce a vacuum inside the detector chamber, the detector chamber comprising an interior and a plurality of walls separating the interior from a surrounding environment;
   at least one source of bias voltage; and
   a sensor located in said detector chamber and having an active surface,
   wherein one of said walls of said detector chamber is near to the active surface of the sensor and is closed by an electrically conductive grid, said electrically conductive grid including a plurality of orifices having a high resistance to a transmission of gas and a low resistance to a transmission of electrons, said electrically conductive grid connected with the at least one source of bias voltage, said orifices defining electron microlenses inside and in front of said orifices, said electron microlenses being created by an electrical field protruding through said orifices, said electrical field originating from a conductive coating inside of the detector chamber, and the conductive coating adapted to be connected to a voltage source.

2. The secondary electron detector of claim 1, wherein the electrically conductive grid is made of copper.

3. The secondary electron detector of claim 1, wherein the electrically conductive grid is constituted by a diaphragm made of electrically insulating material and provided with said orifices, the diaphragm being including a first side near to the sensor, a first conductive coating on the first side, a second side opposite to the first side, and a second conductive coating applied to the second side, the first conductive coating being electrically insulated from the second conductive coating.

4. The secondary electron detector of claim 3, wherein the diaphragm is a polyimide diaphragm.

5. The secondary electron detector of claim 1, wherein the source of bias voltage is a source of bias of 50 V to 2000 V.

6. The secondary electron detector of claim 5, wherein the source of bias voltage is a source of bias voltage of 250 V to 700 V.

7. The secondary electron detector of claim 1, wherein the sensor comprises a light-guide having an input and an output, and further comprising an ionization grid arranged between the input of the light-guide and the electrically conductive grid, the ionization grid adapted to be connected to a source of ionization voltage, and the output of the light-guide adapted to lead to a photo-multiplier input.

8. The secondary electron detector of claim 7, wherein the input of the light-guide is coupled with a scintillator, the scintillator including a surface near to the electrically conductive grid, and the surface of the scintillator having a conductive coating adapted to be connected with a high voltage source.

9. The secondary electron detector of claim 1, wherein the sensor comprises a PIN diode.

10. The secondary electron detector of claim 1, wherein the electrically conductive grid is covered outside the detector chamber with an input screen, the input screen adapted to be connected to a low voltage source of 50 V to 500 V.

11. The secondary electron detector of claim 1, wherein the electrically conductive grid is covered outside of the detector chamber with an input screen, the input screen adapted to be connected to a low voltage source of 80 V to 150 V.

12. The secondary electron detector of claim 10, wherein the input screen is of hemispherical shape.

13. The secondary electron detector of claim 11, wherein the input screen is of hemispherical shape.

* * * * *

UNITED STATES PATENT AND TRADEMARK OFFICE
CERTIFICATE OF CORRECTION

PATENT NO.         : 7,193,222 B2
APPLICATION NO.    : 10/518660
DATED              : March 20, 2007
INVENTOR(S)        : Jacka et al.

It is certified that error appears in the above-identified patent and that said Letters Patent is hereby corrected as shown below:

Column 1:
Line 21, after "specimens" insert --do--.
Line 22, change "," to --;--.

Column 2, line 52, after "collection." insert the following paragraphs:
 --Witold Slowko described in his article in International Symposium "Ion Implantation and other Applications of Ions and Electrons - Ion 2000" a secondary electron detector with a micro-porous plate for environmental scanning electron microscope (SEM), in which he used a micro-porous plate as a diaphragm having a high resistance to a transmission of gas and low resistance to a transmission of electrons. A micro-porous plate could have been a micro channel plate or a micro sphere plates. Micro channels are channels with a diameter approximately 0,01 mm and length 0,5 to 1 mm, what gives the diameter to length ratio 1 : 50 to 1 : 100.
    The disadvantage of such micro channels is above all their very low life expectancy in an environmental SEM, as the micro channels are typically within a few hours so contaminated that they are useless for the purpose for which they were intended in an environmental SEM. Another disadvantage is that they put through a big portion of the backscattered electrons, what has a deteriorating effect on a resolving power of the SEM.--

Column 3, line 4, after "connected." insert the following paragraph:
 --The low resistance to a transmission of electrons is achieved by electron microlenses inside and in front of each orifice in said diaphragm. Electron microlenses are created by an electrical field protruding through the orifices in said diaphragm. This electrical field originates from a conductive coating inside of the detector chamber that is connected to a voltage source.--

UNITED STATES PATENT AND TRADEMARK OFFICE
CERTIFICATE OF CORRECTION

PATENT NO. : 7,193,222 B2
APPLICATION NO. : 10/518660
DATED : March 20, 2007
INVENTOR(S) : Jacka et al.

It is certified that error appears in the above-identified patent and that said Letters Patent is hereby corrected as shown below:

Column 6, line 66, after "diaphragm" delete "being".

Signed and Sealed this

Nineteenth Day of June, 2007

JON W. DUDAS
*Director of the United States Patent and Trademark Office*